United States Patent
Lin

(10) Patent No.: US 11,830,904 B2
(45) Date of Patent: Nov. 28, 2023

(54) LIGHT SENSING DEVICE HAVING OFFSET GATE ELECTRODE AND LIGHT SENSING PANEL AND LIGHT SENSING DISPLAY PANEL USING THE SAME

(71) Applicant: HANNSTOUCH SOLUTION INCORPORATED, Tainan (TW)

(72) Inventor: Sheng-Chia Lin, Tainan (TW)

(73) Assignee: HANNSTOUCH SOLUTION INCORPORATED, Tainan (TW)

( * ) Notice: Subject to any disclaimer, the term of this patent is extended or adjusted under 35 U.S.C. 154(b) by 507 days.

(21) Appl. No.: 16/924,153

(22) Filed: Jul. 8, 2020

(65) Prior Publication Data

US 2022/0013569 A1    Jan. 13, 2022

(51) Int. Cl.
    *H01L 27/146*    (2006.01)
(52) U.S. Cl.
    CPC .............. *H01L 27/14643* (2013.01)
(58) Field of Classification Search
    None
    See application file for complete search history.

(56) References Cited

U.S. PATENT DOCUMENTS

| | | | | |
|---|---|---|---|---|
| 5,083,175 A | * | 1/1992 | Hack | H01L 31/1136 257/53 |
| 5,463,420 A | * | 10/1995 | Yamada | H01L 27/12 348/307 |
| 2007/0235753 A1 | * | 10/2007 | Debucquoy | B82Y 10/00 257/113 |
| 2012/0313913 A1 | * | 12/2012 | Shiraki | G06V 40/1318 345/207 |
| 2013/0093035 A1 | * | 4/2013 | Fertig | H01L 31/1105 257/432 |
| 2013/0201085 A1 | * | 8/2013 | Chang | H10K 59/126 345/76 |
| 2019/0221686 A1 | * | 7/2019 | Allen | H01L 27/14609 |

* cited by examiner

*Primary Examiner* — Michelle Mandala
*Assistant Examiner* — Jordan M Klein
(74) *Attorney, Agent, or Firm* — CKC & Partners Co., LLC

(57) ABSTRACT

A light sensing device includes a substrate, a gate electrode, a semiconductor layer, a dielectric layer, a first source/drain electrode, a second source/drain electrode, and a reset electrode. The gate electrode is over the substrate. The semiconductor layer is over the substrate and at least partially overlapping the gate electrode. The dielectric layer spaces the gate electrode from the semiconductor layer. The first source/drain electrode and the second source/drain electrode are respectively connected to the semiconductor layer. The semiconductor layer has a first region and a second region between the first source/drain electrode and the second source/drain electrode, the first region overlaps the gate electrode, and the second region does not overlap the gate electrode. The reset electrode is in contact with the semiconductor layer.

10 Claims, 15 Drawing Sheets

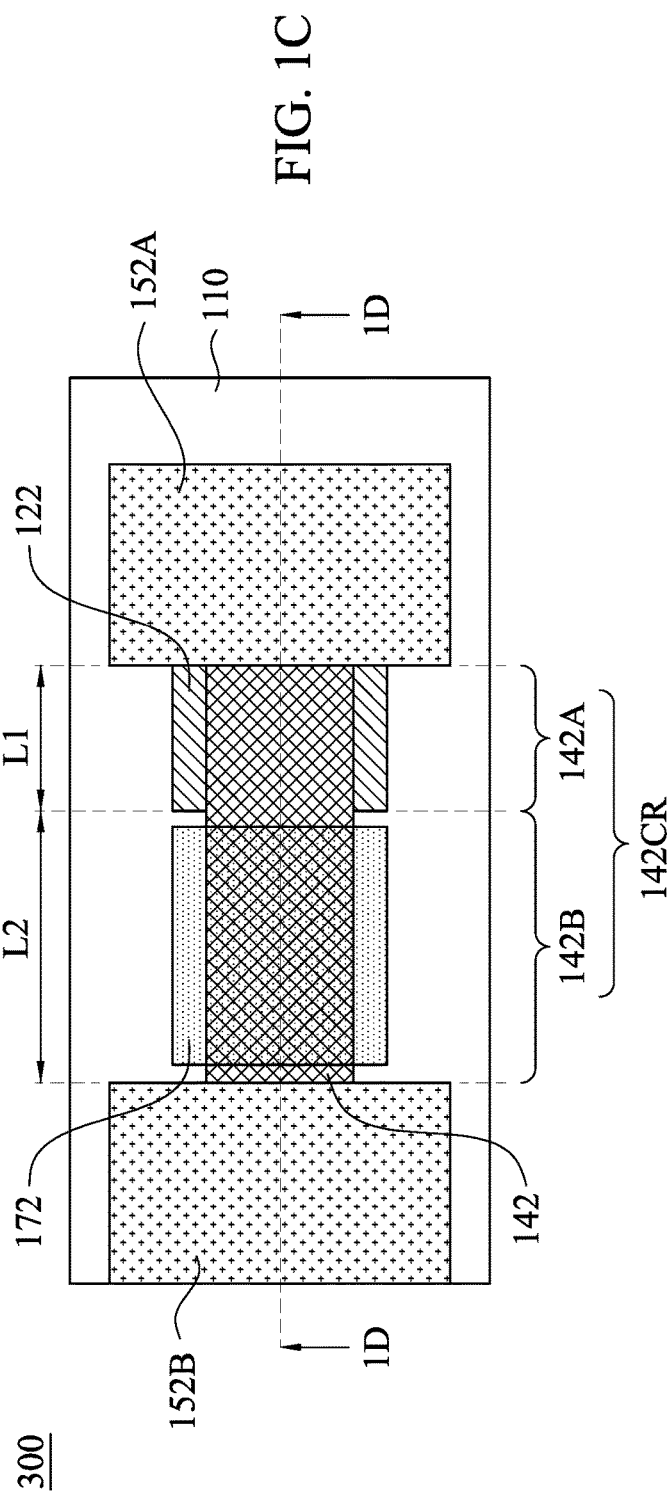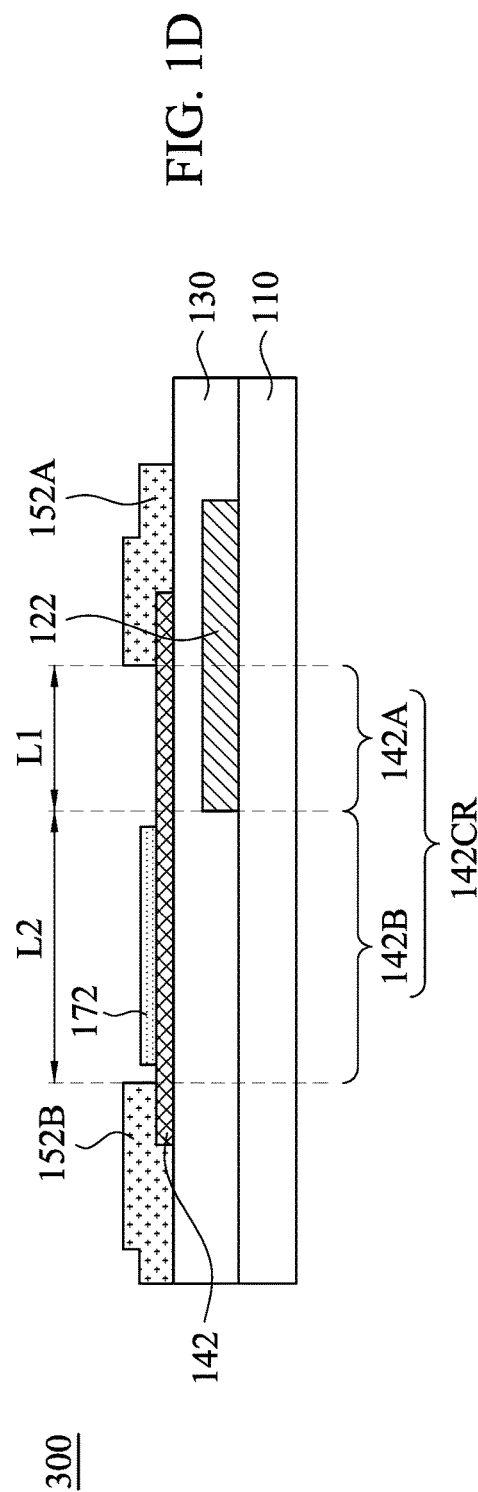

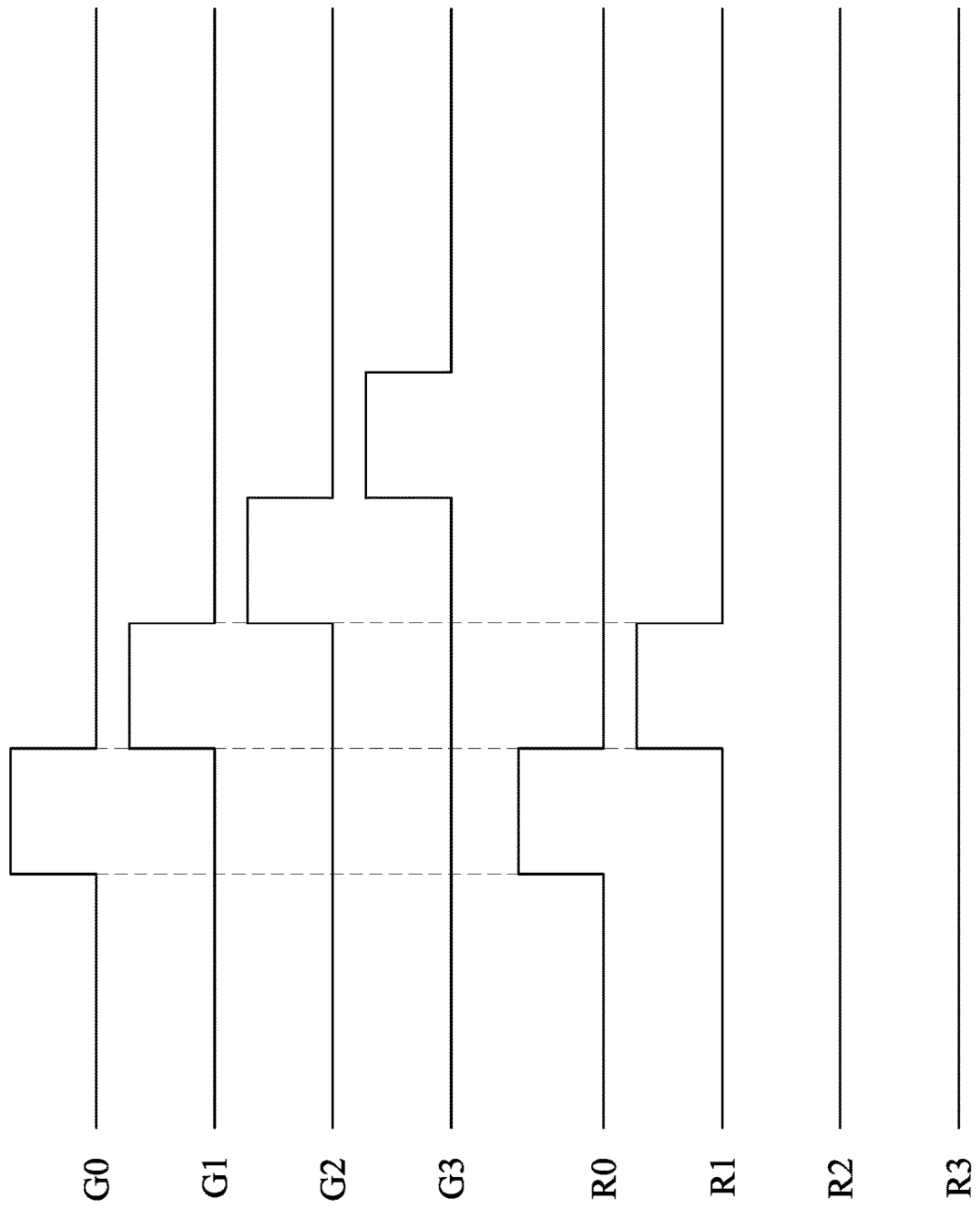

LIGHT SENSING DEVICE HAVING OFFSET GATE ELECTRODE AND LIGHT SENSING PANEL AND LIGHT SENSING DISPLAY PANEL USING THE SAME

BACKGROUND

Field of Invention

The present invention relates to light sensing devices, and light sensing panels and light sensing display panels using the same.

Description of Related Art

Photoelectric sensors can convert light into current or voltage signals. The photoelectric sensors can be manufactured in the form of thin film transistors and arranged in an array, which is then used in the fields of optical touch, fingerprint recognition, X-ray detection, etc. The photoelectric sensor may include a semiconductor thin film having a suitable band gap corresponding to the wavelength of light to be absorbed.

However, after converting light into an electrical signal and sending the electrical signal through an external circuit, residual charges may be left in the photoelectric sensor, and may affect the photosensitive signal at next cycle. Accordingly, how to eliminate the residual charges and thereby improve the sensing accuracy is currently an important issue.

SUMMARY

In various embodiments of the present invention, by designing a reset electrode in the light sensing device, the residual charges in the semiconductor can be removed, thereby improving sensing accuracy. In some embodiments, the light sensing device can operate with a sensing switch device. Alternatively, by designing the light sensing device to have a gate electrode to control part of the channel, the light sensing device can achieve the functions of light sensing and switch simultaneously. In some embodiments, light sensing devices can be applied to a display panel, and the light sensing devices can be manufactured along with the devices and the pixel electrodes in the display panel through a suitable integrated process, thereby saving masks.

According to some embodiments of the present disclosure, a light sensing device includes a substrate, a gate electrode, a semiconductor layer, a dielectric layer, a first source/drain electrode, a second source/drain electrode, and a reset electrode. The gate electrode is over the substrate. The semiconductor layer is over the substrate and at least partially overlapping the gate electrode. The dielectric layer spaces the gate electrode from the semiconductor layer. The first source/drain electrode and the second source/drain electrode are respectively connected to the semiconductor layer. The semiconductor layer has a first region and a second region between the first source/drain electrode and the second source/drain electrode, the first region overlaps the gate electrode, and the second region does not overlap the gate electrode. The reset electrode is in contact with the semiconductor layer.

In some embodiments, the reset electrode is in contact with the second region of the semiconductor layer, and not in contact with the first region of the semiconductor layer.

In some embodiments, a light sensing display panel includes a substrate, at least one scan line, at least one data line, at least one sensing line, at least one pixel unit over the substrate. The pixel unit includes an active device, a pixel electrode, and a light sensing device. The active device is electrically connected to the scan line and the data line. The pixel electrode is electrically connected to the active device. The light sensing device includes a gate electrode, a semiconductor layer, a first source/drain electrode, and a second source/drain electrode. The gate electrode is electrically connected to the scan line, the first source/drain electrode and the second source/drain electrode are respectively connected to the semiconductor layer, the first source/drain electrode is electrically connected to the scan line, and the second source/drain electrode is electrically connected to the sensing line. The semiconductor layer has a first region and a second region between the first source/drain electrode and the second source/drain electrode, the first region overlaps the gate electrode, and the second region does not overlap the gate electrode.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C is a schematic top view of a light sensing device in a pixel unit of FIG. 1A.

FIG. 1D is a schematic cross-sectional view taken along line 1D-1D of FIG. 1C.

FIG. 5C is a signal diagram of operating a light sensing panel according to some embodiments of the present invention.

DETAILED DESCRIPTION

Figure 1A:
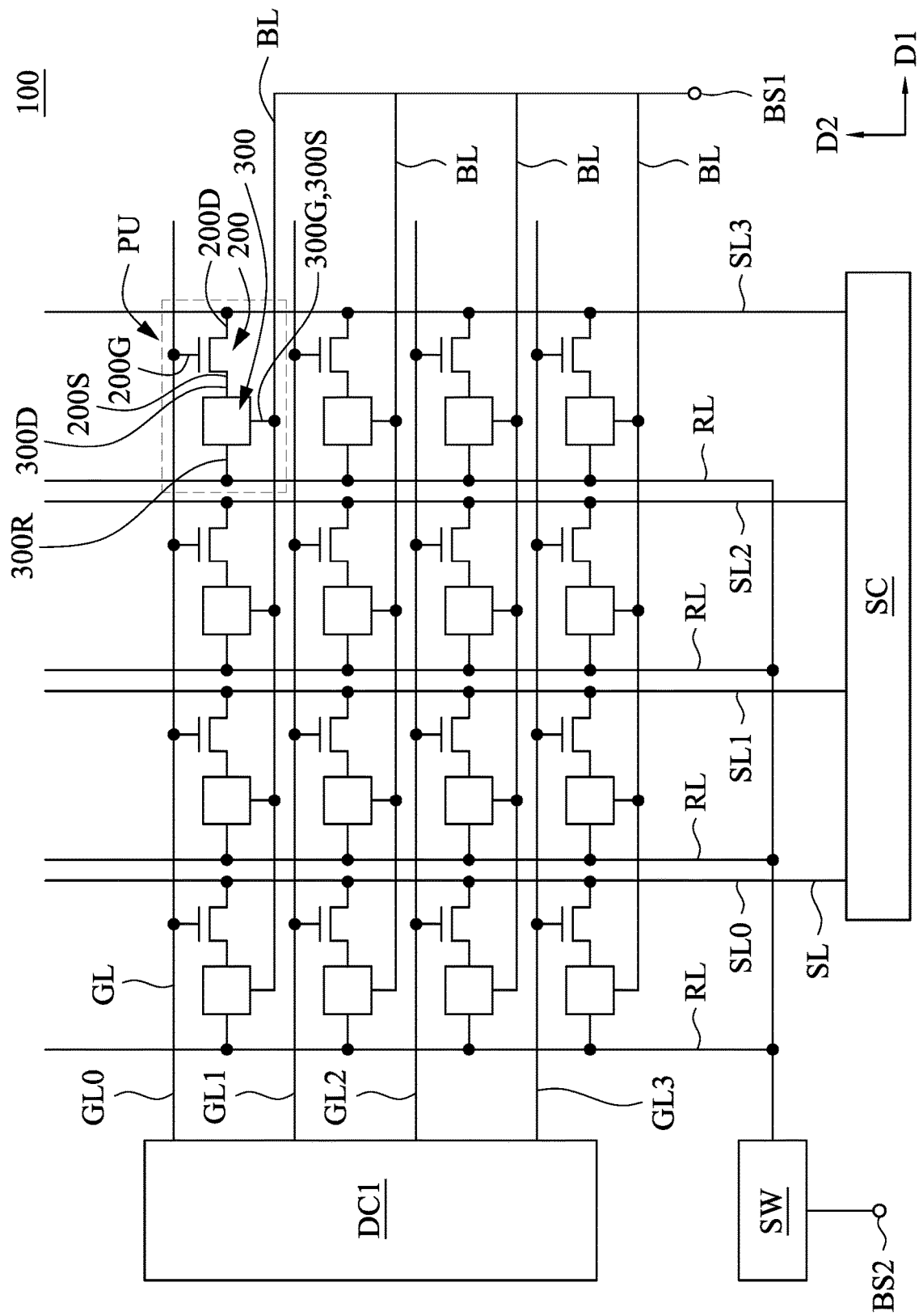
FIG. 1A is a top view of a light sensing panel according to some embodiments of the present invention.

The following invention provides many different embodiments, or examples, for implementing different features of the provided subject matter. Specific examples of components and arrangements are described below to simplify the present invention. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present invention may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a top view of a light sensing panel 100 according to some embodiments of the present invention. The light sensing panel 100 includes plural scan lines GL (e.g., scan lines GL0-GL3), plural sensing lines SL (e.g., sensing lines SL0-SL3), a reset line RL, a bias line BL, and plural pixel units PU. Each of the pixel units PU includes a switch device 200 and a light sensing device 300, in which the switch device 200 is electrically connected to the scan line GL and the sensing line SL, and the light sensing device 300 is electrically connected to the bias line BL, the reset line RL, and the switch device 200. In various embodiments of the present invention, the scan lines GL extend along the first direction D1, and the sensing lines SL extend along the second direction D2, in which the first direction D1 and the second direction D2 intersect each other. For example, the first direction D1 and the second direction D2 are perpendicular to each other. The reset lines RL and the bias lines BL are respectively appropriately arranged to electrically connect the light sensing devices 300 of the pixel units PU.

Figure 1B:
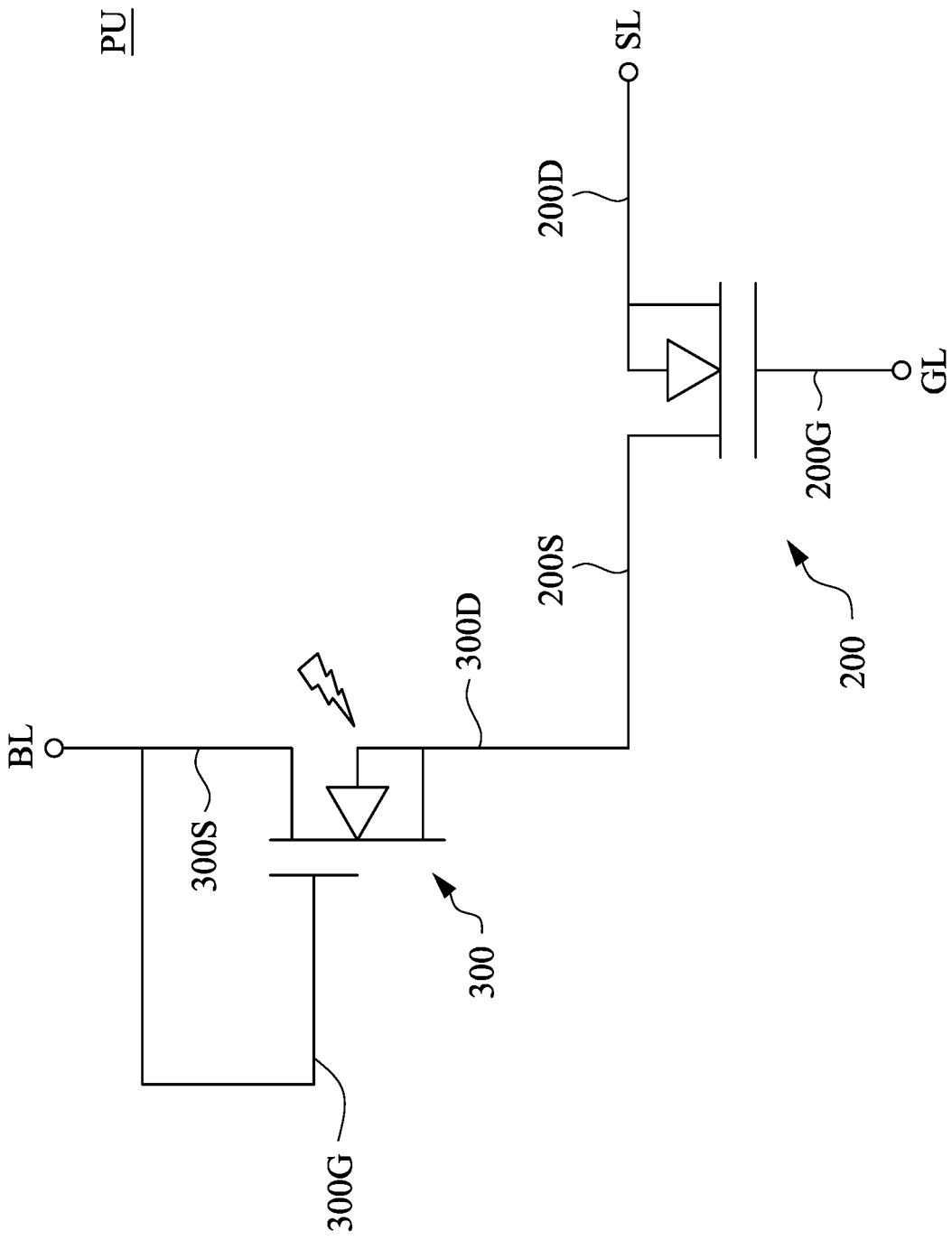
FIG. 1B is a schematic circuit diagram of a pixel unit of the light sensing panel of FIG. 1A.

FIG. 1B is a schematic circuit diagram of the pixel unit PU of FIG. 1A. Reference is made to FIGS. 1A and 1B. In the present embodiments, the switch device 200 includes a control terminal 200G, a first terminal 200S and a second terminal 200D, in which the control terminal 200G is used to control whether the first terminal 200S and the second terminal 200D are conducted or not. The light sensing device 300 includes a control terminal 300G, a first terminal 300S, a second terminal 300D, and a reset terminal 300R. The resistance between the first terminal 300S and the second terminal 300D can be under the control of light and the control terminal 300G, such that the light sensing device 300 can sense light. In some embodiments, the reset terminal 300R of the light sensing device 300 (referring to FIG. 1A) is electrically connected to the reset line RL. In FIG. 1B, the illustration of the reset terminal 300R and the reset line RL is omitted.

In the present embodiments, the first terminal 300S and the control terminal 300G of the light sensing device 300 are connected to a bias potential source BS1 via a bias line BL. The bias potential source BS1 is used to provide an appropriate stable bias potential. The second terminal 300D of the light sensing device 300 is connected to the first terminal 200S of the switch device 200, the control terminal 200G of the switch device 200 is connected to the scan line GL, and the second terminal 200D of the switch device 200 is connected to the sensing line SL. Through the configuration, when light is sensed by the light sensing device 300, the resistance value of its semiconductor layer (e.g., the semiconductor layer 142 of FIG. 1C) is changed (e.g., reduced), the bias potential provided by the bias potential source BS1 will be sent through the bias line BL, from the first terminal 300S to the second terminal 300D, to the first terminal 200S of the switch device 200, and from the first terminal 200S to the second terminal 200D by turning on the switch device 200 using the scan line GL, such that the light sensing signal may be read out from the sensing line SL.

In some embodiments of the present invention, the light sensing panel 100 further includes a driving circuit DC1 and a sensing circuit SC. The driving circuit DC1 is electrically connected to each scan line GL (e.g., scan lines GL0 to GL3). Through the configuration, the driving circuit DC1 can time-sequentially provide signals to the scan lines GL0 to GL3. The sensing circuit SC is electrically connected to each sensing line SL (e.g., the sensing lines SL0 to SL3) to obtain signals from the sensing lines SL0 to SL3, respectively. In some embodiments, the light sensing panel 100 further includes a reset switch SW, which can be controlled by an appropriate reset signal (e.g., the reset signal TRST of FIG. 1E) to electrically conduct the reset line RL and a stable potential source BS2. The potential of the stable potential source BS2 may be lower than the potential of the bias potential source BS1. For example, the potential of the stable potential source BS2 may be a ground potential. Through the configuration, the residual charges in the light sensing device 300 can be eliminated by turning on the reset switch SW. In some embodiments, a reset signal can be provided through an appropriate circuit to control whether to turn on the reset switch SW, in which the circuit can be independent of the driving circuit DC1. Alternatively, in some other embodiments, the circuit may be included in the driving circuit DC1, and the driving circuit DC1 is capable of determining whether to turn on the reset switch SW by providing a reset signal to the reset switch SW.

In some embodiments of the present invention, referring to FIG. 1A, the bias line BL extends along the first direction D1 and is parallel to the scan line GL, and the reset line RL extends along the second direction D2 and is parallel to the sensing line SL. Of course, it should not limit the scope of the present invention. In some other embodiments, the bias line BL may extend along the second direction D2 and be parallel to the sensing line SL, and the reset line RL may extend along the first direction D1 and be parallel to the scan line GL. In still other embodiments, the bias line BL and the reset line RL may extend in the same direction, such as the first direction D1 or the second direction D2. In various embodiments of the present invention, the scan line GL, the sense line SL, the reset line RL, and the bias line BL are not connected to each other.

FIG. 1C is a schematic top view of a light sensing device 300 in a pixel unit PU of FIG. 1A. FIG. 1D is a schematic cross-sectional view taken along line 1D-1D of FIG. 1C. The light sensing panel 100 includes a substrate 110. The light sensing device 300 is disposed on the substrate 110 of the light sensing panel 100. The light sensing device 300 includes a gate electrode 122, a semiconductor layer 142, source/drain electrodes 152A, 152B, and a reset electrode 172.

In some embodiments, the gate electrode 122 is disposed on the substrate 110. In some embodiments, the semiconductor layer 142 is disposed on the gate electrode 122 and at least partially overlaps with the gate electrode 122. The semiconductor layer 142 and the gate electrode 122 can be separated by an insulating layer 130. The semiconductor layer 142 may be a semiconductor material having a suitable band gap, and the semiconductor material can absorb light and change its own resistance accordingly. The source/drain electrodes 152A and 152B may be connected to two ends of the semiconductor layer 142, respectively.

In the present embodiments, the gate electrode 122 and the source/drain electrode 152B are separated by a gap having a length L2, such that the gate electrode 122 is offset. Through the configuration, a part of the semiconductor layer 142 of the light sensing device 300 near the source/drain electrode 152B is under the control of the gate electrode 122, and another part of the semiconductor layer 142 of the light sensing device 300 near the source/drain electrode 152A is free of the control of the gate electrode 122. The light sensing device 300 of the present embodiments can be used for optical fingerprint recognition, which can be achieved by sensing the reflected light of the fingerprint.

Furthermore, in some embodiments, the semiconductor layer 142 has a channel region 142CR between the source/drain electrodes 152A and 152B, the channel region 142CR is divided into a first region 142A and a second region 142B, the first region 142A is located on the gate electrode 122, and the second region 142B is not located on the gate electrode 122. In some embodiments, the boundary between the first region 142A and the second region 142B of the semiconductor layer 142 is aligned with the edge of the gate electrode 122. Through the configuration, the resistance value of the entire channel region 142CR of the semiconductor layer 142 (i.e., the first region 142A and the second region 142B) can be adjusted by the light, and the resistance value of the first region 142A of the semiconductor layer 142 can be further be tuned by the control of the gate electrode 122.

In some embodiments, one side of the channel region 142CR of the semiconductor layer 142 adjacent to the source/drain electrode 152A overlaps the gate electrode 122, and the other side of the channel region 142CR of the semiconductor layer 142 adjacent to the source/drain electrode 152B does not overlap the gate electrode 122. Through the configuration, the first region 142A controlled by the gate electrode 122 is completely located on a side of the second region 142B that is not controlled by the gate electrode 122. This configuration allows an edge of the first region 142A to be directly connected to a conductor (for example, the source/drain electrode 152A), which is beneficial for using the gate electrode 122 to accurately control the resistance value of the first region 142A of the semiconductor layer 142. Moreover, in some further embodiments, the gate electrode 122 can also overlap the source/drain electrode 152A.

In some embodiments, the size of the first region 142A controlled by the gate electrode 122 may be different from the size of the second region 142B that is not controlled by the gate electrode 122. For example, the size of the second region 142B is greater than the size of the first region 142A. For example, the length L2 of the second region 142B is greater than the length L1 of the first region 142A. Alternatively, in some other embodiments, the size of the second region 142B may be designed to be smaller than the size of the first region 142A. For example, the length L2 of the second region 142B may be smaller than the length L1 of the first region 142A. In some embodiments of the present invention, the length L1 of the first region 142A and the length L2 of the second region 142B can be adjusted so that the light sensing device 300 itself can achieve the good switch effect. For example, the length L1 can be designed to be in the range of 2 micrometers to 10 micrometers, and the length L2 can be designed to be in the range of 2 micrometers to 10 micrometers. In the embodiments where the light sensing device 300 can achieve the good switch effect, the configuration of the switch device 200 can be omitted.

In some embodiments, the reset electrode 172 is disposed on the semiconductor layer 142 and in contact with a top surface of the semiconductor layer 142. In some embodiments, the residual charges in the semiconductor layer 142 can be reduced or removed by the reset electrode 172, thereby improving the sensing accuracy and the sensing sensitivity of the light sensing panel 100. In the present embodiments, the reset electrode 172 may be formed of a suitable transparent conductive material, such as indium tin oxide (ITO), nano silver wire, or a combination thereof. For example, the light transmittance of the reset electrode 172 may be designed to be greater than 60%, or even greater than 80%. Alternatively, in some embodiments, the reset electrode 172 may be made of a suitable metal mesh or thin metal wires, so as not to block light. Through the configuration, light can penetrate the reset electrode 172 and be absorbed by the semiconductor layer 142, thereby generating electrons, which keeps realizing the light sensing effect.

In the present embodiments, the reset electrode 172 is disposed on the second region 142B of the semiconductor layer 142, but not disposed on the first region 142A. Of course, it should not limit the scope of the present invention. In some other embodiments, the reset electrode 172 may be disposed on the first region 142A and the second region 142B. Alternatively, the reset electrode 172 may be disposed on the first region 142A, but not on the second region 142B. In some other embodiments, the configuration of the reset electrode 172 may be omitted.

In some embodiments, the gate electrode 122 may be formed of a suitable conductive material, such as molybdenum, titanium, chromium, tantalum, tungsten, aluminum, copper, alloys thereof, or the combination thereof. In some embodiments, the semiconductor layer 142 may be formed of a suitable semiconductor material, such as amorphous silicon, other suitable materials, or a combination thereof. The insulating layer 130 may be formed of a suitable insulating material, such as silicon nitride, silicon oxide, silicon oxynitride, or a combination thereof. In some embodiments, the source/drain electrode 152A and 152B may be formed of suitable conductive materials, such as molybdenum, titanium, chromium, tantalum, tungsten, aluminum, copper, alloys thereof, or combinations thereof.

It should be understood that in some embodiments of the present invention, the gate electrode 122, the source/drain electrode 152A, the source/drain electrode 152B, and the reset electrode 172 in FIGS. 1C and 1D may separately form the control terminal 300G, the first terminal 300S, the second terminal 300D, and the reset terminal 300R of the light sensing device 300 in FIGS. 1A and 1B. In some embodiments, the reset line RL of FIG. 1A and the reset electrode 172 may be formed by patterning the same conductive layer, and the reset line RL and the reset electrode 172 may include the same material, such as the aforementioned transparent conductive material (e.g., indium tin oxide) or a conductive material that can be used to form a metal mesh. Of course, it should not limit the scope of the present invention. In other embodiments, the reset line RL and other electrode wires (e.g., the scan line GL, the source/drain electrodes 152A, 152B, or the sensing line SL) may be formed by patterning the same conductive layer. The reset line RL may include suitable metal materials.

In the present embodiments, the scan lines GL of FIG. 1A and the gate electrode 122 may be formed by patterning the same conductive layer, and the scan lines GL and the gate electrode 122 may include the same material. In some embodiments, the bias lines BL of FIG. 1A may be formed by patterning the same conductive layer as that of the scan lines GL and the gate electrode 122, so that the bias lines BL, the scan lines GL, and the gate electrode 122 may include the same material. Alternatively, in other embodiments, the bias lines BL may be provided in other ways. For example, the bias lines BL may be formed by patterning the same conductive layer as that of the source/drain electrodes 152A, 152B and the sensing line SL, not limited to be formed by patterning the same layer as that of the scan lines GL. Other details of the present embodiments are similar to those described above, and therefore not repeat herein.

In various embodiments of the present invention, the sensing switch device 200 and the light sensing device 300 may include N-type channels, the first terminals 200S and 300S may act as sources, and the second terminals 200D and 300D may act as drains. In some other embodiments, the sensing switch device 200 and the light sensing device 300 may include P-type channels, the first terminals 200S and 300S may act as drains, and the second terminals 200D and 300D may act as sources. In still some other embodiments, some of these devices may include N-type channels, and some of these devices may include P-type channels.

Figure 1E:
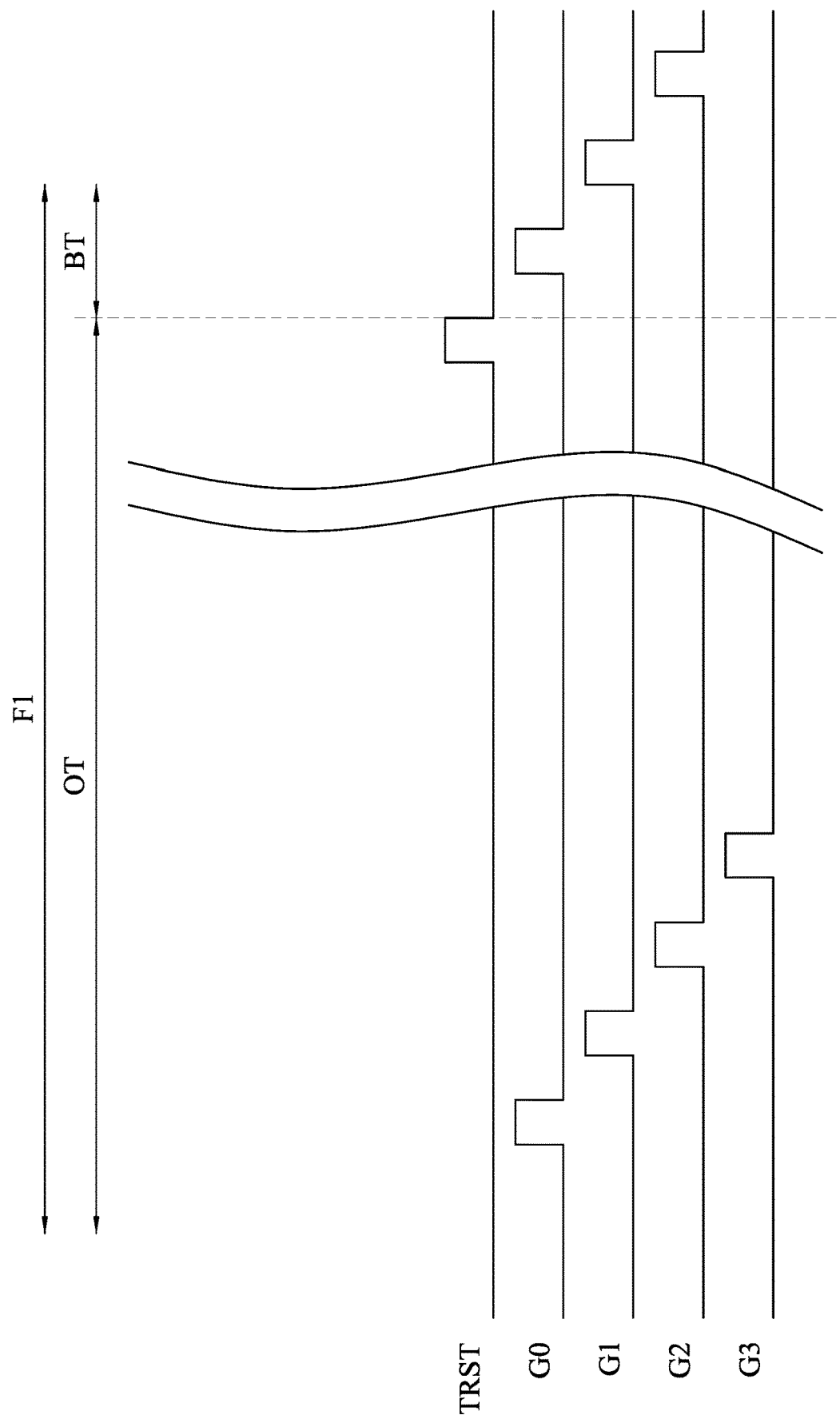
FIG. 1E is a signal diagram of operating a light sensing panel according to some embodiments of the present invention.

FIG. 1E is a signal diagram of operating a light sensing panel 100 according to some embodiments of the present invention. Reference is made to both FIGS. 1A and 1E. In some embodiments, the driving circuit DC1 can provide the scanning signals G0-G3 to the scan lines GL0-GL3, respectively. As shown in the figure, the reset signal TRST further defines the operation time OT and the blanking time BT in each scan period F1. Accordingly, in the operation time OT of each scanning cycle F1, through the scanning signals G0-G3, the switch devices 200 of each row are turned on in a time sequence, and the sensing circuit SC may read out the light sensing signals of the light sensing devices 300 of each row through the sensing lines SL0-SL3 in a time sequence.

In the present embodiments, the reset signal TRST can be provided to the reset switch SW, thereby controlling the reset switch SW to be turned on or off. When the reset switch SW is turned on, the blanking time BT is initiated, and the reset line RL will be connected to a stable potential source BS2. The potential of the stable potential source BS2 may be lower than the potential of the bias potential source BS1. For example, the potential of the stable potential source BS2 may be a ground potential. Thus, by grounding the reset electrode 172 (i. e., the reset terminal 300R) or connecting the reset electrode 172 to other suitable potential, parts or all of the residual charges in the semiconductor layers 142 in the light sensing devices 300 can be removed.

In some embodiments, in the blanking time BT of each scan period F1, the scan lines GL0-GL3 can turn on the switch devices 200 in a time sequence, and residual charges in the semiconductor layers 142 of the light sensing devices 300 is eliminated through the path of the switch devices 200. It should be understood that the number of scan signals G0-G3, scan lines GL0-GL3, and sense lines SL0~SL3 are merely illustrated as examples, and should not be used to limit the scope of the present invention.

Figure 2A:
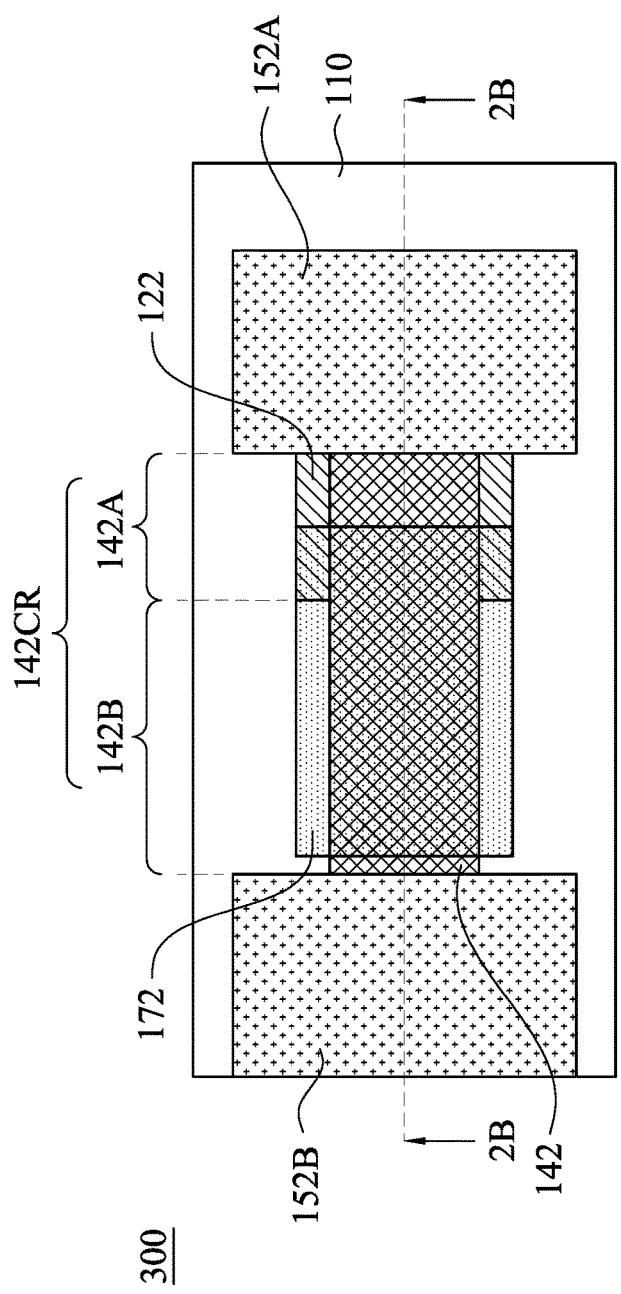
FIG. 2A is a schematic top view of a light sensing device according to some embodiments of the present invention.
Figure 2B:
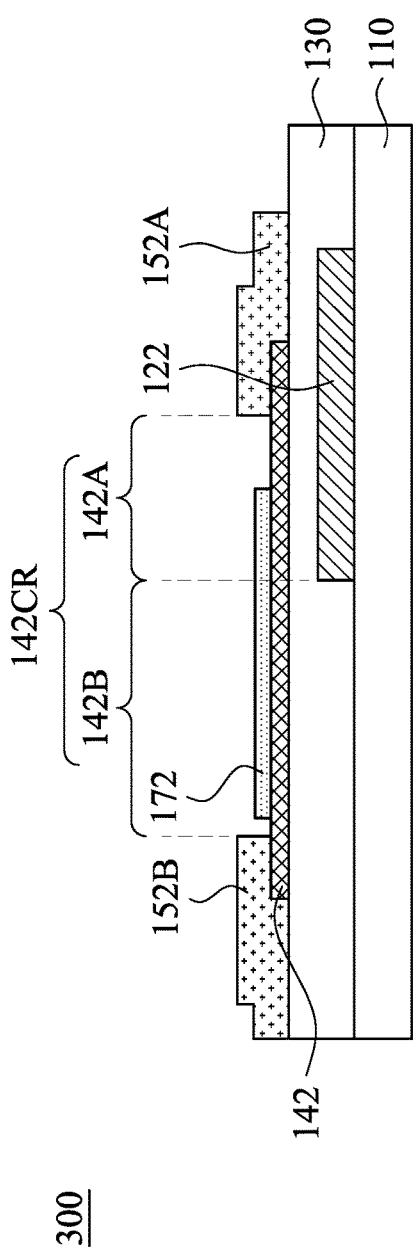
FIG. 2B is a schematic cross-sectional view taken along line 2B-2B of FIG. 2A.

FIG. 2A is a schematic top view of a light sensing device 300 according to some embodiments of the present invention. FIG. 2B is a schematic cross-sectional view taken along line 2B-2B of FIG. 2A. The present embodiments are similar to the embodiments of FIGS. 1C and 1D, except that in the present embodiments, the reset electrode 172 at least partially overlaps the gate electrode 122. Specifically, the reset electrode 172 may be disposed on the first region 142A and the second region 142B of the semiconductor layer 142. Other details of the present embodiments are similar to those described above, and therefore not repeat herein.

Figure 3:
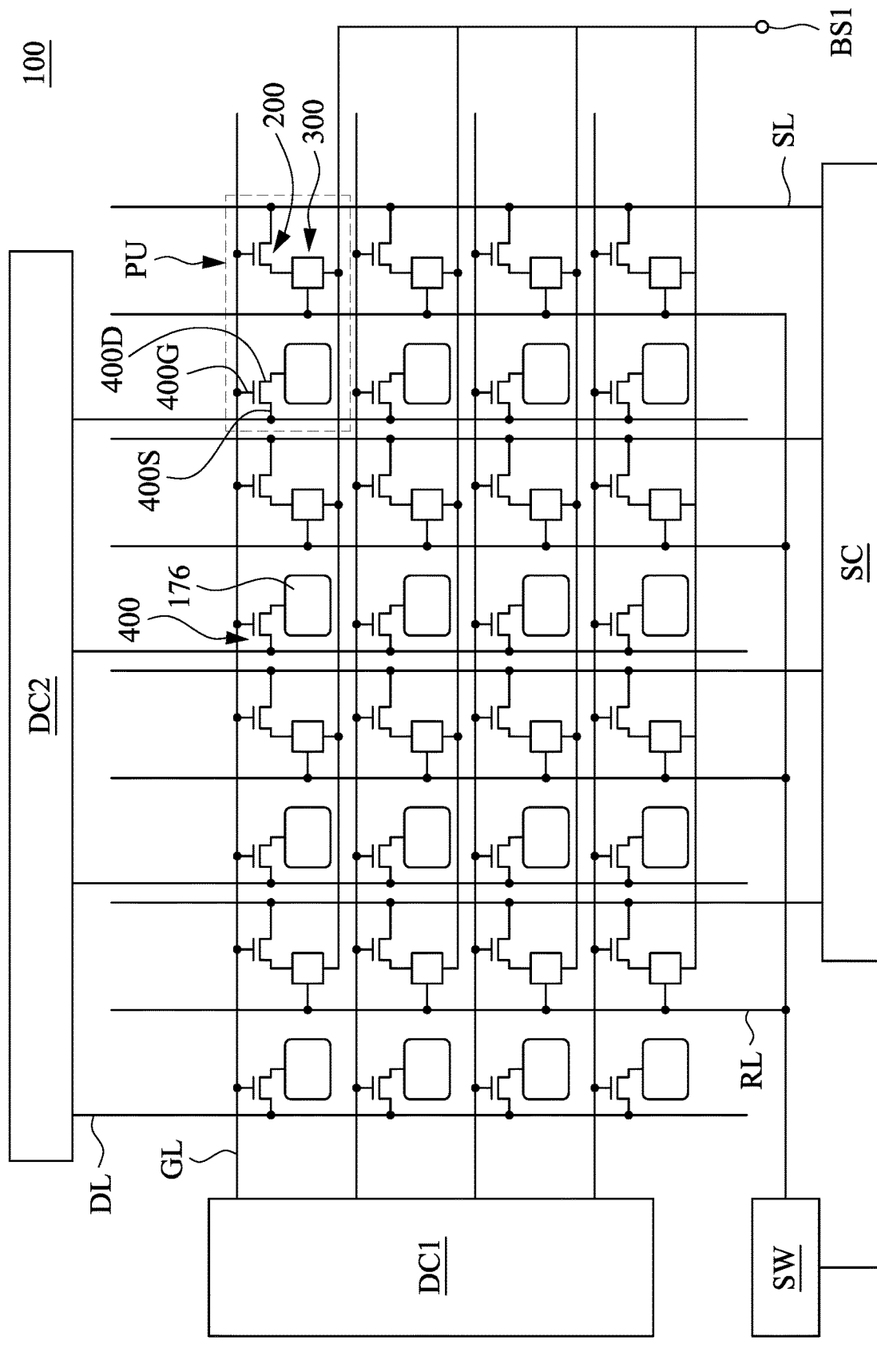
FIG. 3 is a top view of a light sensing panel according to some embodiments of the present invention.

FIG. 3 is a top view of a light sensing panel 100 according to some embodiments of the present invention. The present embodiments are similar to the embodiments of FIG. 1A, except that the pixel unit PU may further include a display switch device 400 and a pixel electrode 176 in the present embodiments, so that the light sensing panel 100 can achieve the display effect. The display switch device 400 may include a control terminal 400G, a first terminal 400S, and a second terminal 400D, where the control terminal 400G is used to control whether the first terminal 400S and the second terminal 400D are electrically conducted with each other. The control terminal 400G can be connected to the scanning line GL. The light sensing panel 100 may further include a data line DL, and the first terminal 400S and the second terminal 400D are respectively connected to the data line DL and the pixel electrode 176. The light sensing panel 100 further includes a data driving circuit DC2 to time-sequentially provide appropriate data signals to each data line DL. Through the configuration, through the control of the driving circuit DC1 and the scanning line GL, the data signal provided by the data driving circuit DC2 can be time-sequentially sent to each pixel electrode 176 through the data line DL, thereby controlling the light intensity of each pixel to achieve the purpose of display. In some embodiments, the light sensing panel 100 includes two substrates and a liquid crystal layer sandwiched between the substrate. The pixel electrodes 176 may be located between the liquid crystal layer and one of the substrates, and each of the pixel electrodes 176 may be used for driving a correspond portion of the liquid crystal layer, thereby realizing the display effect.

In the present embodiments, since the display switch device 400 and the switch device 200 of the same pixel unit PU are controlled by the same scan line GL, the display switch device 400 and the switch device 200 in the same pixel unit PU can be turned on at the same time point. Through the configuration, at the same time point, the pixel unit PU may achieve the display effect by electrically conducting the pixel electrode 176 to the data line DL through the display switch device 400, and achieve the purpose of sensing light by electrically conducting the light sensing device 300 to the sensing line SL through the switch device 200. By arranging the light sensing device 300 and the pixel electrode 176 in the same pixel unit PU, the resolution of the light sensing devices 300 is comparable to the resolution of the pixel electrodes 176 for display, which may improve the sensing resolution. Other details of the present embodiments are generally as described above, and will not be repeated here.

Figure 4:
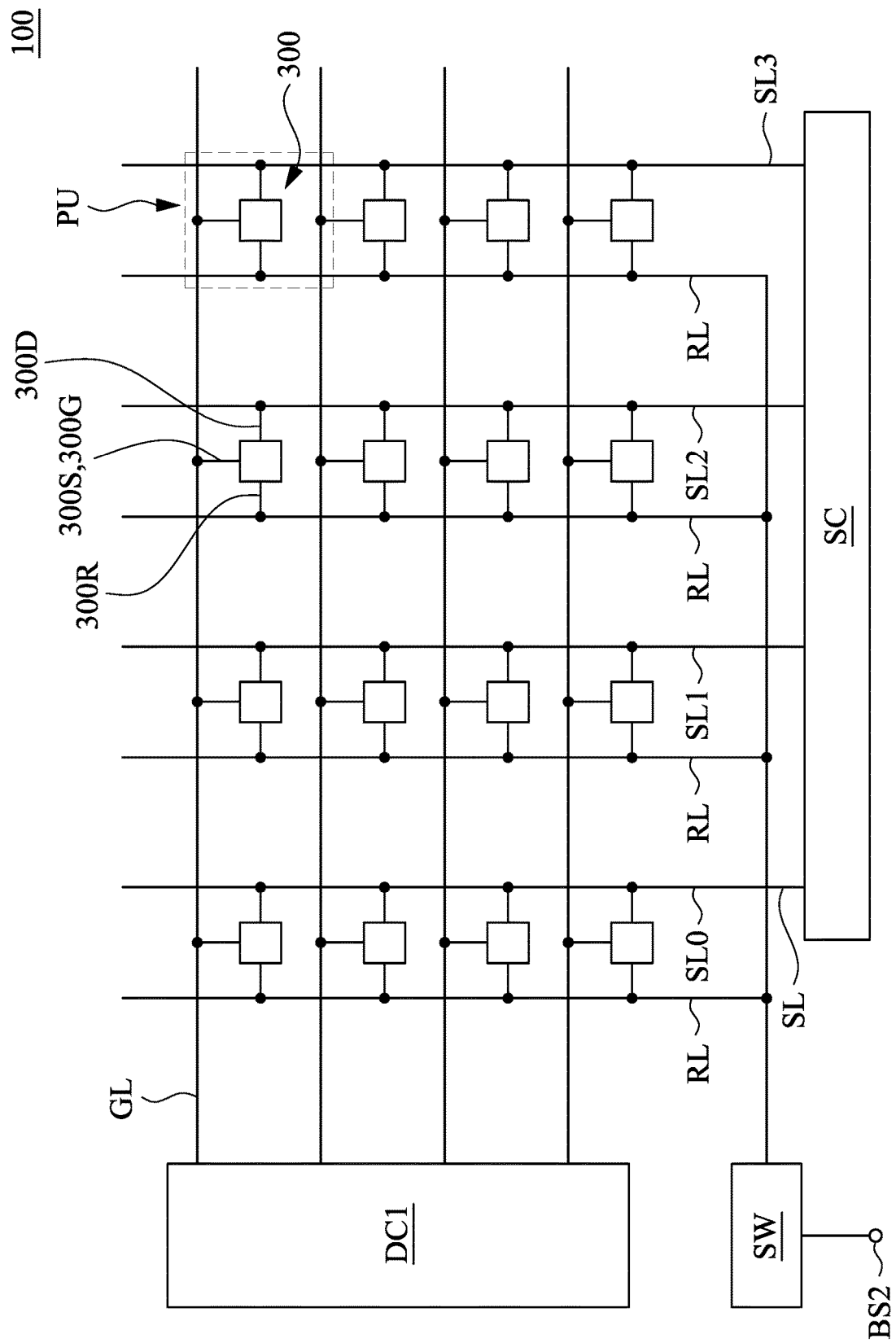
FIG. 4 is a top view of a light sensing panel according to some embodiments of the present invention.

FIG. 4 is a top view of a light sensing panel 100 according to some embodiments of the present invention. The present embodiments are similar to the embodiments of FIG. 1A, except that the pixel unit PU of the light sensing panel 100 does not include the switch device 200 (referring to FIGS. 1A and 1B) in the present embodiment. In the present embodiments, by adjusting the configuration of the gate electrode 122 and the semiconductor layer 142 (referring to FIGS. 1C and 1D, for example, adjusting the channel length L2 of the second region 142B), the light sensing device 300 itself can achieve the good switch effect. For example, for performing a sensing operation of the light sensing panel 100, an on-voltage is applied on the gate electrode 122 (i.e., the control terminal 300G in FIG. 4) through the scan line GL. During the sensing operation, when the pixel unit PU is not exposed to light, the light sensing device 300 may not be electrically conducted. Once the pixel unit PU is exposed to light during the sensing operation, the light sensing device 300 would have an electrical conductance between the terminals 300S and 300D in response to the amount of the absorbed light, thereby sending a current to the sensing line SL. Therefore, the sensing operation of the light sensing panel 100 may be performed when the pixel units PU of the light sensing panel 100 are free of the switch device 200 (referring to FIGS. 1A and 1B).

In the present embodiments, the first terminal 300S and the control terminal 300G of the light sensing device 300 are connected to the scan line GL, and the second terminal 300D of the light sensing device 300 is connected to the sensing line SL. Through the configuration, when the light sensing device 300 senses light and changes the resistance value of the semiconductor layer (e.g., reducing the resistance value of the semiconductor layer), the signal of the scanning line GL will be sent from the first terminal 300S to the second terminal 300D, and further to the sensing line SL. Other details of the present embodiments are described as above, and therefore not repeated herein.

Figure 5A:
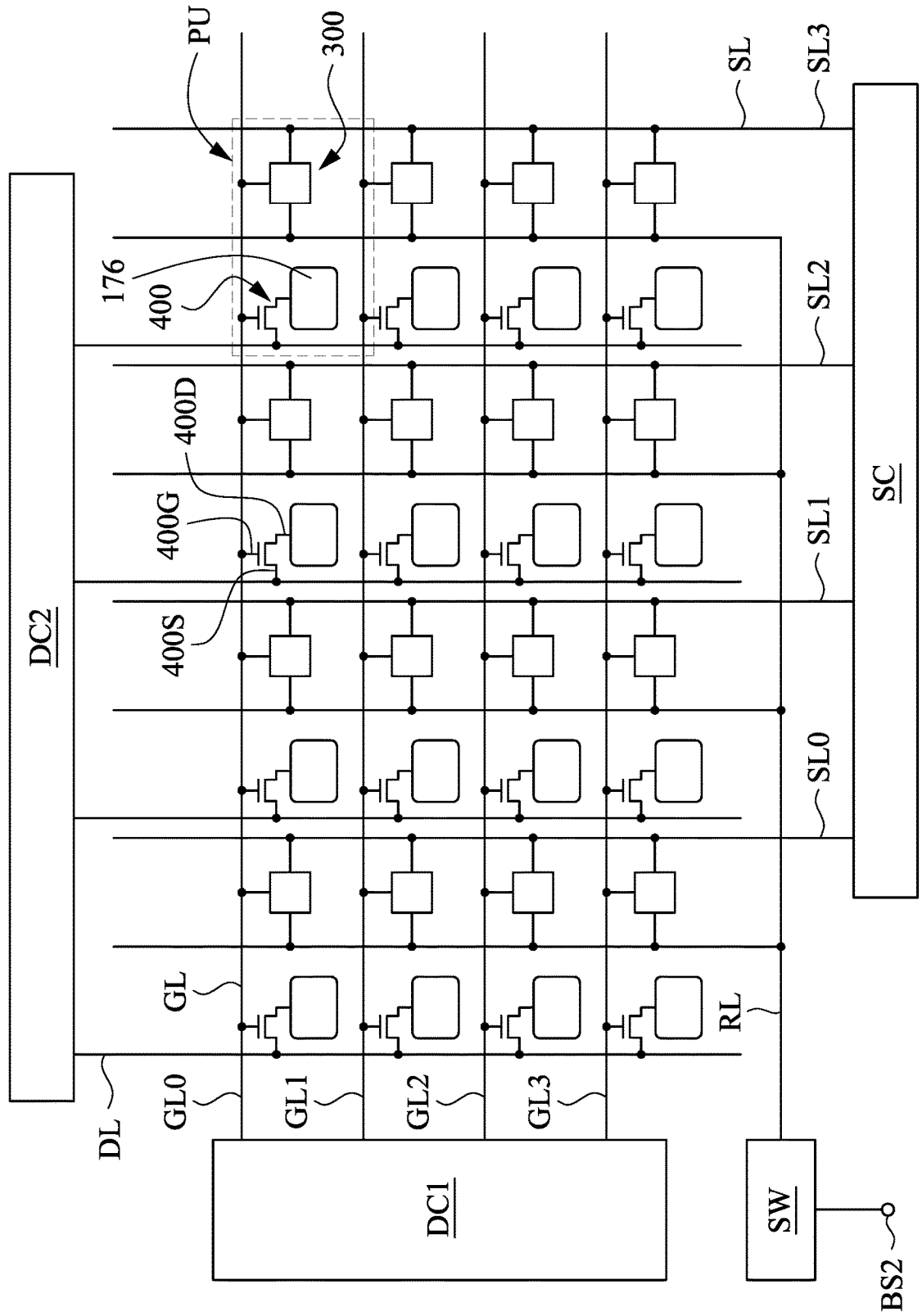
FIG. 5A is a top view of a light sensing panel according to some embodiments of the present invention.
Figure 5B:
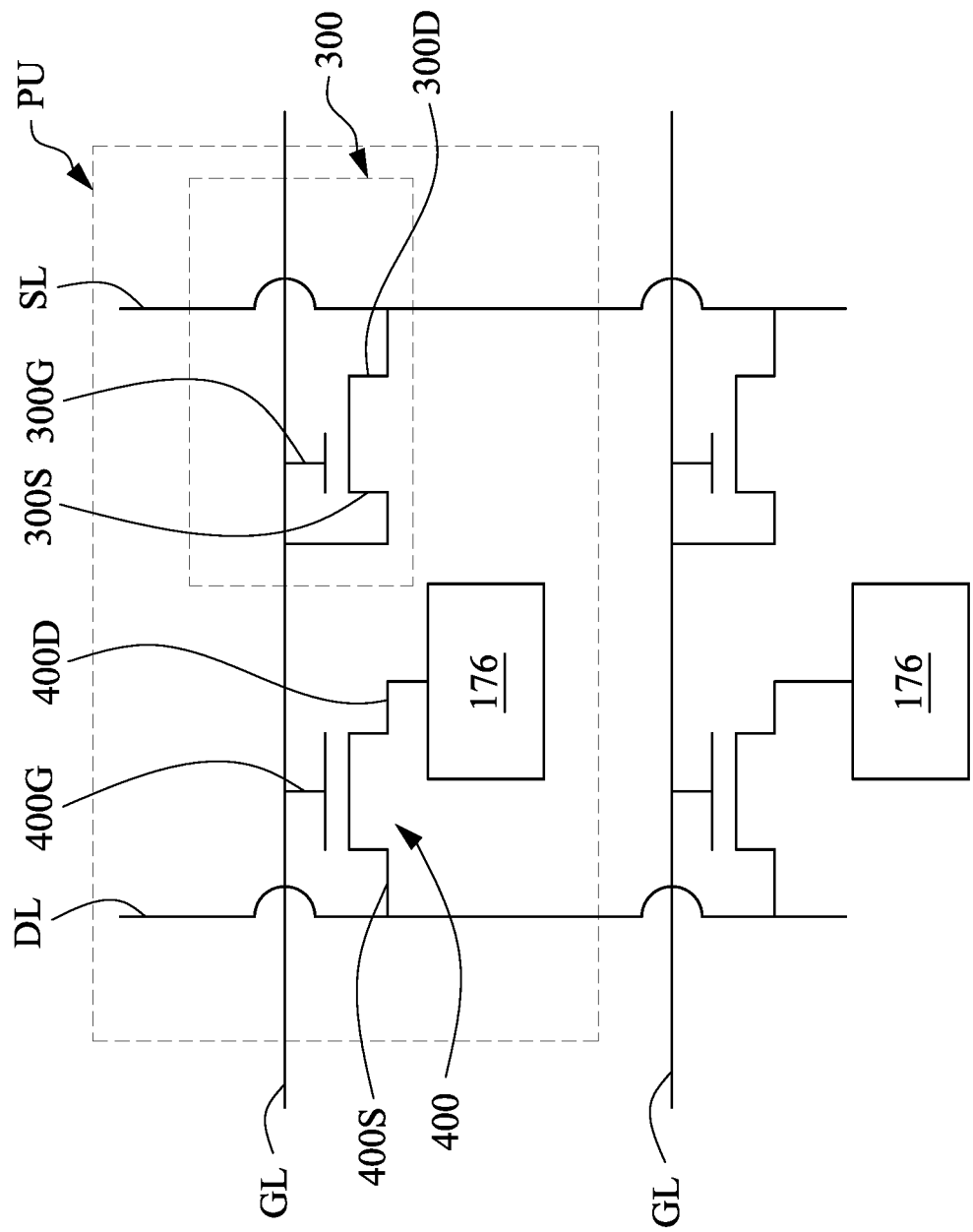
FIG. 5B is a schematic circuit diagram of a pixel unit of the light sensing panel of FIG. 5A.

FIG. 5A is a top view of a light sensing panel 100 according to some embodiments of the present invention. FIG. 5B is a schematic circuit diagram of the pixel unit PU of the light sensing panel 100 of FIG. 5A. The present embodiments are similar to the embodiments of FIG. 4, the difference is that: the pixel unit PU of the light sensing panel 100 may further include a display switch device 400 and a pixel electrode 176 in the present embodiments, so that the light sensing panel 100 may achieve the display effect. The display switch device 400 may include a control terminal 400G, a first terminal 400S, and a second terminal 400D, in which the control terminal 400G is connected to the scan line GL (e.g., scan lines GL0-GL3). The light sensing panel 100 may further include a data line DL, and the first terminal 400S and the second terminal 400D are respectively connected to the data line DL and the pixel electrode 176. As aforementioned, each of the pixel electrodes 176 may be used for driving a correspond portion of the liquid crystal layer, thereby realizing the display effect.

It is noted that, in some other embodiments, the light sensing device 300 may be free of the reset electrode 172 (referring to FIGS. 1C and 1D), and the light sensing panel 100 may not include the reset terminal 300R and the reset line RL. For brief illustration, the reset terminal 300R and the reset line RL are omitted in FIG. 5B.

In some embodiments, for performing a sensing operation of the light sensing panel 100, an on-voltage is applied on the gate electrode 122 (i.e., the control terminal 300G in FIG. 5B) through the scan line GL. During the sensing operation, when the pixel unit PU is not exposed to light, the light sensing device 300 would not be electrically conducted, and therefore no current is sent to the source/drain electrode 152A (i.e., the second terminal 300D in FIGS. 1A-1B). Once the pixel unit PU is exposed to light during the sensing operation, the light sensing device 300 would have an electrical conductance in response to the amount of the absorbed light, thereby sending a current to the source/drain electrode 152A (i.e., the second terminal 300D in FIG. 5B). Therefore, each of the light sensing device 300 can be formed with a corresponding one of the display switch devices 400 and a corresponding one of the pixel electrodes 176 in a corresponding one of the pixel units PU without additional switch device (e.g., the switch devices 200 in FIGS. 1A and 1B), That is, the sensing operation of the light sensing panel 100 may be performed when the pixel units PU of the light sensing panel 100 are free of the switch device 200 (referring to FIGS. 1A and 1B).

In the present embodiments, by arranging the light sensing device 300 and the pixel electrode 176 in the same pixel unit PU, the resolution of the light sensing devices 300 is comparable to the resolution of the pixel electrodes 176 for display, thereby improving the sensing resolution.

FIG. 5C is a signal diagram of operating a light sensing panel 100 according to some embodiments of the present invention. Reference is made to FIG. 5A-5C. In the present embodiments, the scan signals G0-G3 are respectively provided to the scan lines GL0-GL3, and through the scan lines GL0-GL3, the display switch device 400 and the light sensing device 300 in the same pixel unit PU can be turned on at the same time. Through the configuration, at the same time point, the pixel unit PU may achieve the display effect by electrically conducting the data line DL and the pixel electrode 176 through the display switch device 400, and achieve the purpose of detection by sensing the light through the light sensing device 300. For example, the signals R0-R3 are the sensing signals obtained by the sensing circuit SC via the sensing lines SL0-SL3, respectively.

Other details of the present embodiments are described as above, and therefore not be repeated herein.

FIGS. 6 to 9 illustrate a process of fabricating the light sensing panel 100 according to some embodiments of the present invention. The substrate 110 has regions 112, 114, and 116, in which light sensing devices, sensing switch devices, and display switch devices are formed over the regions 112, 114, and 116, respectively.

Figure 6:
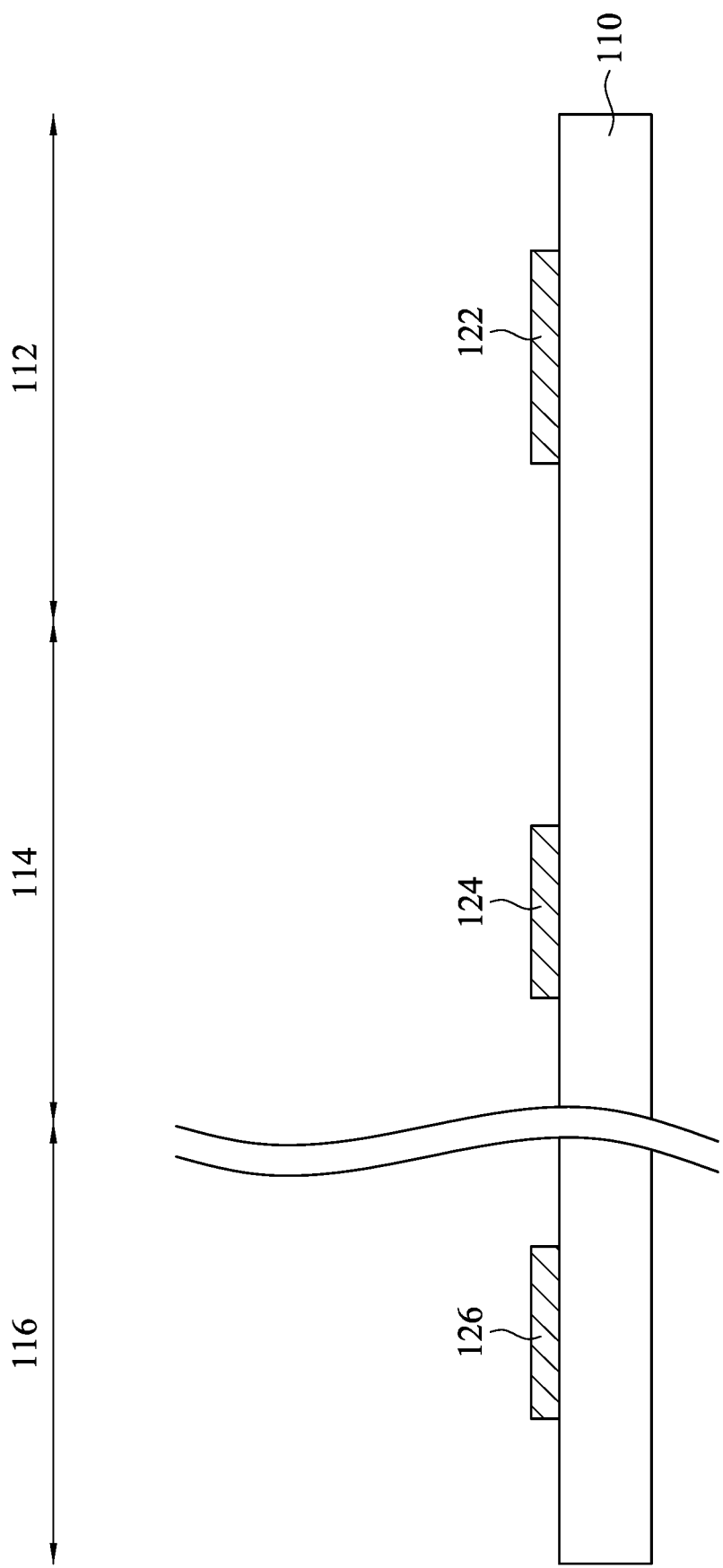
FIGS. 6-9 illustrate a process of fabricating a light sensing panel according to some embodiments of the present invention.

Referring to FIG. 6, on the substrate 110, gate electrodes 122, 124, and 126 are formed over the regions 112, 114, and 116, respectively. Here, a conductive material layer may be deposited over the substrate 110 first, and then the conductive material layer is patterned by an appropriate method (e.g., etching process) to form gate electrodes 122, 124, and 126.

Figure 7:
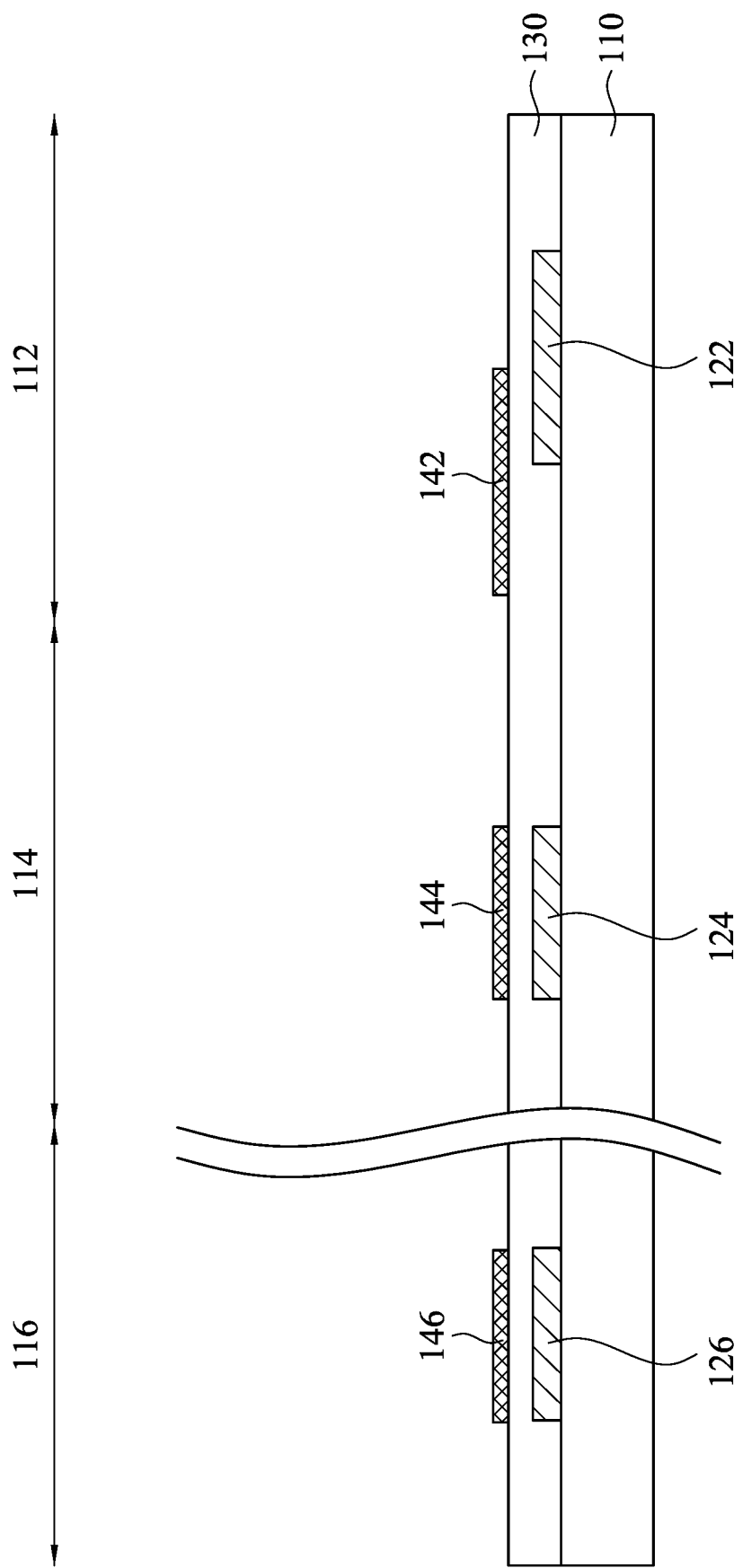

Referring to FIG. 7, an insulating layer 130 is formed over the gate electrodes 122, 124, and 126. Thereafter, the semiconductor layers 142, 144, and 146 are formed over the insulating layer 130 in the regions 112, 114, and 116, respectively. Here, a semiconductor material layer may be deposited on the insulating layer 130 first, and then the semiconductor material layer may be patterned by an appropriate method (e.g., etching process) to form the semiconductor layers 142, 144, and 146.

Figure 8:
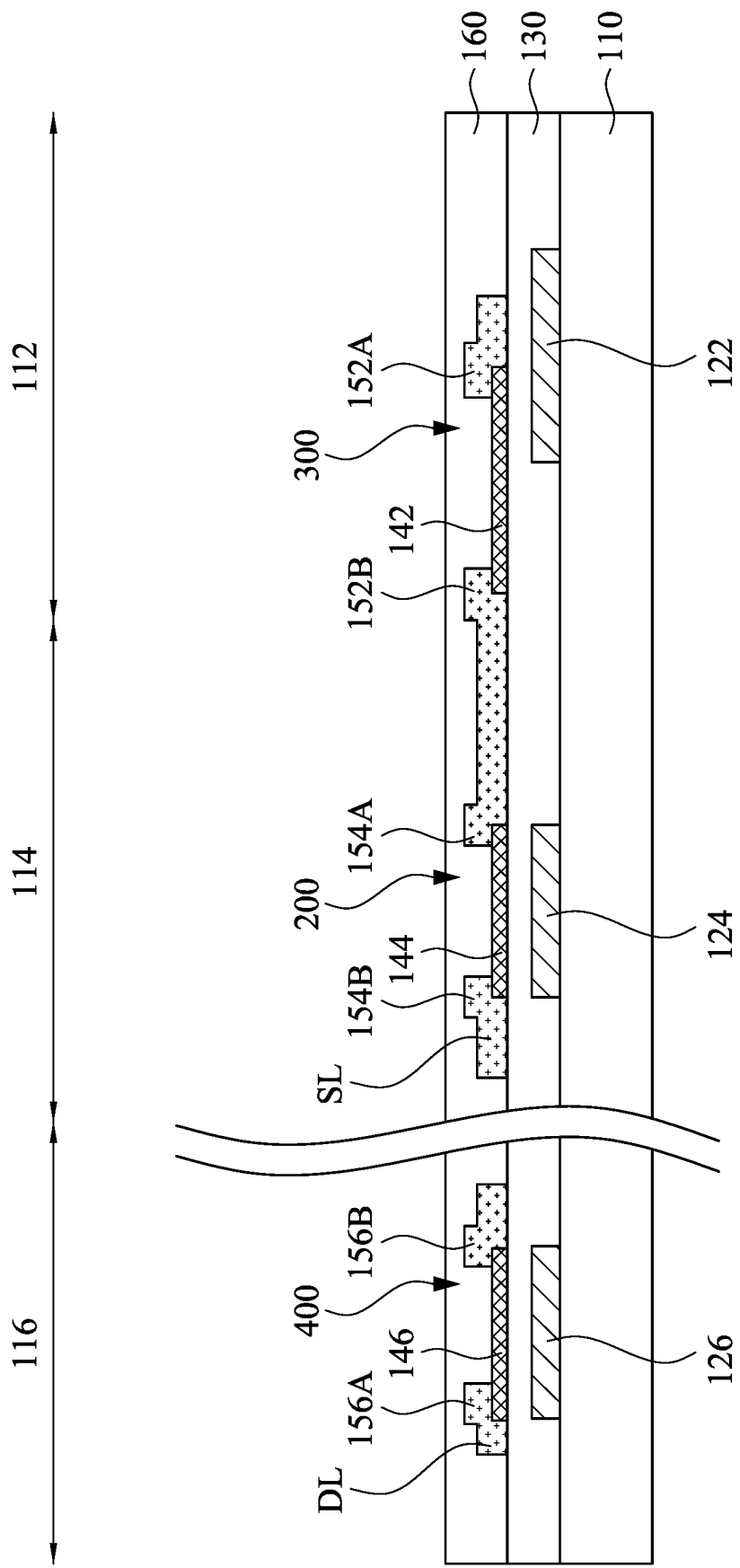

Referring to FIG. 8, data lines DL, sensing lines SL, source/drain electrodes 152A, 152B, 154A, 154B, 156A, and 156B are formed over the insulating layer 130 and the semiconductor layers 142, 144, and 146. In some embodiments, a conductive material layer may be deposited over the structure of FIG. 7, and then the conductive material layer is patterned by an appropriate method (e.g., etching process) to form the data lines DL, the sensing lines SL, and the source/drain electrodes 152A, 152B, 154A, 154B, 156A, 156B.

Through the configuration, the sensing switch device 200, the light sensing device 300, and the display switch device 400 are formed. In the present embodiments, the source/drain electrode 152B of the light sensing device 300 is connected to the source/drain electrode 154A of the sensing switch device 200.

Subsequently, an insulating layer 160 may be formed over the data lines DL, the sensing lines SL, and the source/drain electrodes 152A, 152B, 154A, 154B, 156A, 156B. The material of the insulating layer 160 can be a suitable insulating material, such as silicon dioxide, silicon oxynitride, or the combination thereof.

Figure 9:
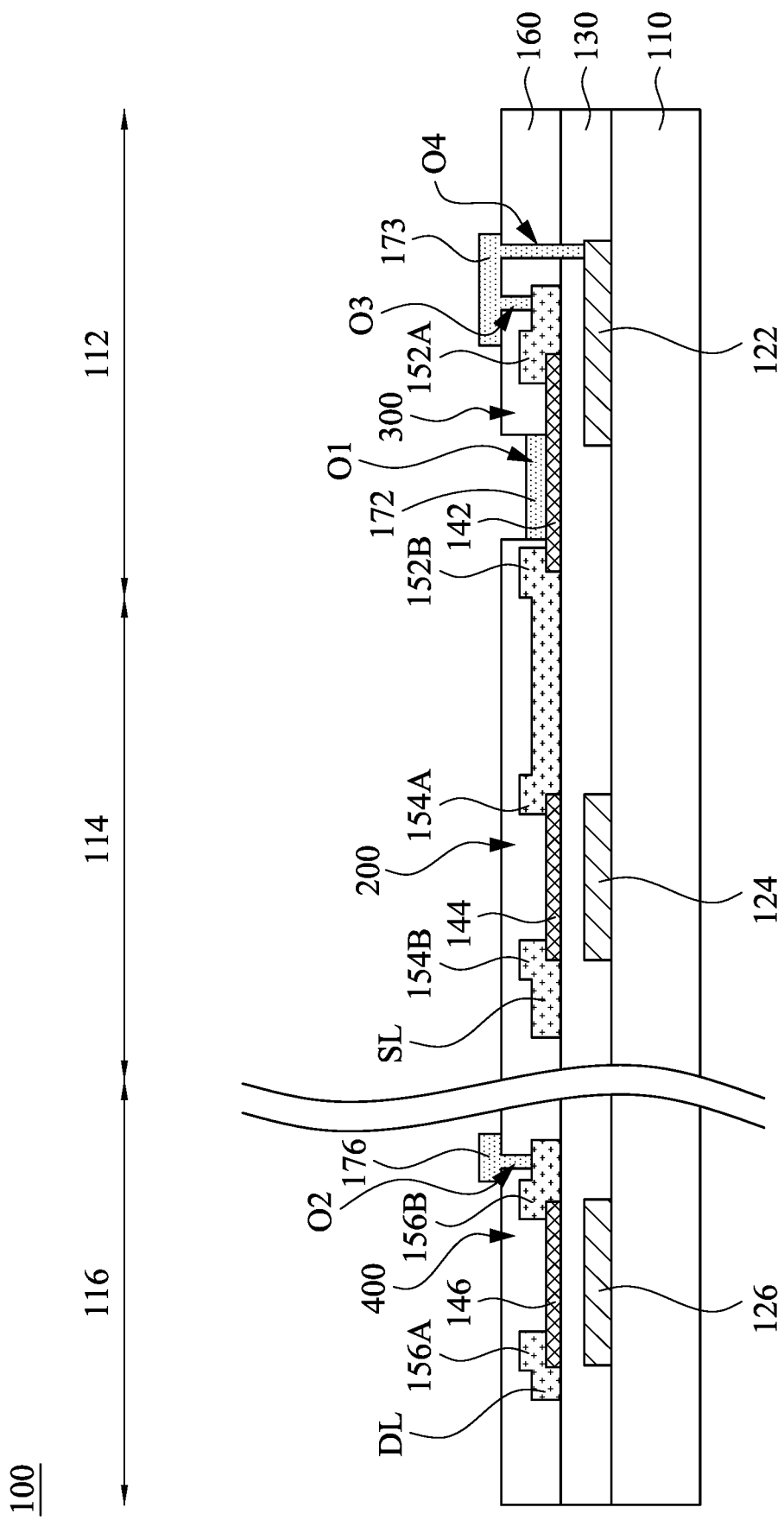

Referring to FIG. 9, the reset electrode 172 and the pixel electrode 176 are formed in the regions 112 and 116. Herein, the openings O1-O4 can be formed in the insulating layer 160, and then a transparent conductive material layer can be deposited thereon. Subsequently, the transparent conductive material layer can be patterned by an appropriate method (e.g., etching process) to form the reset electrode 172, the pixel electrode 176, and the conductive connection structure 173. Herein, the reset electrode 172 may be partially disposed in the opening O1 of the insulating layer 160 and in contact with the semiconductor layer 142 below. The pixel electrode 176 may be partially disposed in the opening O2 and connected to the source/drain electrode 156B below. The conductive connection structures 173 may be partially disposed in the openings O3 and O4 to electrically connect the source/drain electrode 152A to the gate electrode 122. In some embodiments, the configurations of the openings O3 and O4 and the conductive connection structure 173 can be omitted, and the source/drain electrode 152A can be electrically connected to the gate electrode 122 through other applicable approaches. In some embodiments, the reset electrode 172, the pixel electrode 176, and the conductive connection structure 173 can also be formed by depositing and patterning a metal layer, in which the reset electrode 172 and the pixel electrode 176 are formed in the form of metal mesh, thereby maintaining the light transmittance.

In various embodiments of the present invention, the sensing switch device 200, the light sensing device 300, and the display switch device 400 may include N-type channels, and the source/drain electrodes 152A, 154A, 156A may be used as source, and the source/drain electrodes 152B, 154B, 156B can be used as a drain. In other embodiments, the sensing switch device 200, the light sensing device 300, and the display switch device 400 may include P-type channels, and the source/drain electrodes 152A, 154A, and 156A may be used as drains. The electrodes 152B, 154B, and 156B can be used as source electrodes. In other embodiments, some of these devices may include N-type channels, while some of these devices may include P-type channels, and therefore it is not intended to limit the types of the source/drain electrodes 152A, 152B, 154A, 154B, 156A, and 156B.

Figure 10:
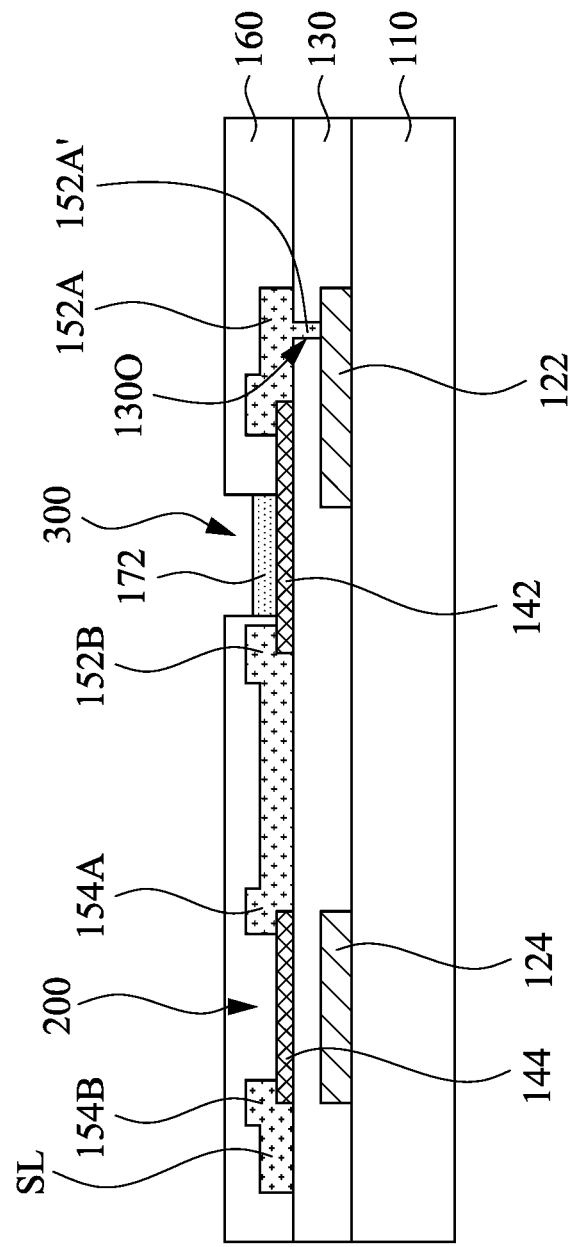
FIG. 10 is a cross-sectional view of a light sensing panel according to some embodiments of the present invention.

FIG. 10 is a schematic cross-sectional view of a light sensing panel 100 according to some embodiments of the present invention. The present embodiments are similar to the embodiments of FIG. 9, except that the source/drain electrodes 152A is connected to the gate electrode 122 through the conductive vias 152A' in the present embodiments, and therefore the configuration of the conductive connection structure 173 is omitted. Specifically, in the present embodiments, before the deposition of the conductive material layer for forming the source/drain electrode, an opening 1300 may be formed in the insulating layer 130, such that during the deposition of the conductive material layer for forming the source/drain electrode, the conductive material layer may be deposited into the opening 1300, thereby forming a conductive via 152A'. After patterning the conductive material layer, the source/drain electrode 152A may be connected to the gate electrode 122 via the conductive via 152A' in the opening 1300.

In various embodiments of the present invention, by designing the light sensing device to have the reset electrode, the residual charges in the semiconductor can be removed, thereby improving the sensing accuracy and sensing sensitivity. The light sensing device can operate with a sensing switch. Alternatively, by designing the light-sensing device with a gate electrode to control part of the channel, the light-sensing device can simultaneously achieve the functions of light sensing and switching. In some embodiments, light sensing devices can be applied to a display panel, and the light sensing devices can be manufactured along with the devices and the pixel electrodes in the display panel through a suitable integrated process, thereby saving masks.

The foregoing outlines features of several embodiments so that those skilled in the art may better understand the aspects of the present disclosure. Those skilled in the art should appreciate that they may readily use the present invention as a basis for designing or modifying other processes and structures for carrying out the same purposes and/or achieving the same advantages of the embodiments introduced herein. Those skilled in the art should also realize that such equivalent constructions do not depart from the spirit and scope of the present invention, and that they may make various changes, substitutions, and alterations herein without departing from the spirit and scope of the present invention.

What is claimed is:

1. A light sensing device, comprising:
    a substrate;
    a gate electrode over the substrate;
    a semiconductor layer over the substrate and at least partially overlapping the gate electrode;
    a dielectric layer spacing the gate electrode from the semiconductor layer;
    a first source/drain electrode and a second source/drain electrode, respectively connected to the semiconductor layer, wherein the semiconductor layer has a first region and a second region between the first source/drain electrode and the second source/drain electrode, the first region overlaps the gate electrode, and the second region does not overlap the gate electrode; and
    a reset electrode having a portion in direct contact with a top surface of the second region of the semiconductor layer and free of overlapping the gate electrode.

2. The light sensing device of claim 1, wherein the reset electrode is not in contact with a top surface of the first region of the semiconductor layer.

3. The light sensing device of claim 1, wherein the semiconductor layer is above the gate electrode.

4. The light sensing device of claim 1, wherein the reset electrode is made of a transparent conductive material.

5. A light sensing panel, comprising:
    the light sensing device of claim 1;
    at least one sensing line over the substrate; and
    at least one reset line over the substrate, wherein the gate electrode is electrically connected to the first source/drain electrode, the second source/drain electrode is electrically connected to the sensing line, and the reset electrode is electrically connected to the reset line.

6. The light sensing panel of claim 5, further comprising:
    at least one bias line over the substrate, wherein the gate electrode and the first source/drain electrode are electrically connected to the bias line;
    at least one scan line over the substrate; and
    at least one sensing switch device, wherein a control terminal of the sensing switch device is connected to the scan line, and the second source/drain electrode is electrically connected to the sensing line through the sensing switch device.

7. The light sensing panel of claim 6, further comprising:
at least one data line over the substrate;
a display switch device, wherein a control terminal of the display switch device is connected to the scan line; and
a pixel electrode, wherein the pixel electrode is electrically connected to the data line through the display switch device.

8. The light sensing panel of claim 7, wherein the reset electrode and the pixel electrode are made of the same material.

9. The light sensing device of claim 1, wherein a length of the second region of the semiconductor layer is greater than a length of the first region of the semiconductor layer.

10. The light sensing device of claim 1, wherein the semiconductor layer is a silicon layer.

* * * * *